(12) United States Patent
Ishii

(10) Patent No.: US 8,576,474 B2
(45) Date of Patent: Nov. 5, 2013

(54) MEMS DEVICES WITH AN ETCH STOP LAYER

(76) Inventor: Fusao Ishii, Menlo Park, CA (US)

( * ) Notice: Subject to any disclaimer, the term of this patent is extended or adjusted under 35 U.S.C. 154(b) by 381 days.

(21) Appl. No.: 12/009,389

(22) Filed: Jan. 17, 2008

(65) Prior Publication Data

US 2008/0218844 A1    Sep. 11, 2008

Related U.S. Application Data

(63) Continuation-in-part of application No. 10/918,677, filed on Aug. 14, 2004, now Pat. No. 7,183,618, and a continuation-in-part of application No. 11/136,041, filed on May 23, 2005, now Pat. No. 7,304,783, and a continuation-in-part of application No. 11/183,216, filed on Jul. 16, 2005, now Pat. No. 7,215,460.

(60) Provisional application No. 60/930,151, filed on May 12, 2007.

(51) Int. Cl.
*G02B 26/00* (2006.01)
*G02B 26/08* (2006.01)

(52) U.S. Cl.
USPC ............... 359/290; 359/212.1; 359/223.1

(58) Field of Classification Search
USPC .............. 359/237, 245, 254, 290–292, 212.1, 359/214.1, 223.1
See application file for complete search history.

(56) References Cited

U.S. PATENT DOCUMENTS

| | | | |
|---|---|---|---|
| 6,781,208 B2 * | 8/2004 | Okumura | 257/415 |
| 6,856,069 B2 * | 2/2005 | Miller et al. | 310/311 |
| 6,894,822 B2 * | 5/2005 | Blech et al. | 359/247 |
| 6,917,459 B2 | 7/2005 | Nikkel et al. | |
| 7,375,874 B1 * | 5/2008 | Novotny et al. | 359/291 |
| 7,382,513 B2 * | 6/2008 | Yang | 359/290 |
| 2004/0190377 A1 | 9/2004 | Lewandowski et al. | |
| 2005/0094242 A1 | 5/2005 | Ishii | |
| 2006/0034006 A1 | 2/2006 | Ishii | |

\* cited by examiner

*Primary Examiner* — Tuyen Tra
(74) *Attorney, Agent, or Firm* — Bo-In Lin

(57) ABSTRACT

This invention discloses a MEMS device supported on a substrate formed with electric circuit thereon. The MEMS device includes at least an electrode connected to the circuit and at least a movable element that is controlled by the electrode. The MEMS device further includes a conformal protective layer over the electrode and the circuit wherein the protective layer is semiconductor-based material. In a preferred embodiment, the MEMS device is a micromirror and the semiconductor material is one of a group of materials consisting of Si, SiC, Ge, SiGe, SiNi and SiW.

15 Claims, 16 Drawing Sheets

MEMS DEVICES WITH AN ETCH STOP LAYER

This application is a Non-provisional application claiming a Priority date of May 12, 2007 based on a previously filed Provisional Application 60/930,151 and Provisional Application 60/930,151 is a Continuation in Part (CIP) application of another U.S. patents application Ser. Nos. 10/918,677 filed on Aug. 14, 2004 and now issued into U.S. Pat. No. 7,183,618. The disclosures made in these patent applications filed by the same Applicant of this Non-Provisional Application are hereby incorporated by reference in this patent application. This application is further a Continuation-in-Part Application of two previously filed application Ser. Nos. 11/136,041 filed on May 23, 2005 (now issued into U.S. Pat. No. 7,304,783) and 11/183,216 filed on Jul. 16, 2005 (now issued into U.S. Pat. No. 7,215,460). The disclosures made in these applications as filed by the same application of this application are further incorporated by reference.

TECHNICAL FIELD

This invention relates to manufacturing process in applying the mechanical electrical micro-machining system (MEMS) technology and improved device configuration by applying the manufacturing processes. More particularly, this invention relates to manufacturing processes in producing the MEMS devices with a strong protection layer to resist from an attack by etchant during release etching to remove a sacrificial layer. This invention is particularly advantageous when electrodes are exposed as actuators, sensors and micromirrors.

BACKGROUND ART

Even though there are significant advances made in recent years on the technologies of manufacturing and implementing the electromechanical actuators, sensors and micromirror devices as spatial light modulator; there are still technical limitations and difficulties in the manufacturing process. There is a difficulty in a process of releasing the sacrificial layers due to the fact it is difficult to release the sacrificial layers without causing damages to other structures. Specifically, when the etchant for releasing the sacrificial layers is strong acid such as HF, the structure is often damaged, because the etchant can penetrate protective layers.

MEMS devices have drawn considerable interest because of their application as sensors, actuators and display devices. MEMS devices often have a structure as shown in FIG. 1 where an electronic circuit is formed on a substrate and the circuit provides voltage or current to electrodes or senses voltage or current from the electrodes. MEMS structures are often formed over the top or close to the electrodes with a gap between the electrodes and MEMS structure.

The gap is often formed using a technique of sacrificial layer formation followed by a release etching process. This process is exemplified in FIG. 2. FIG. 2A shows that electronic circuit is formed on a substrate. FIG. 2B shows the configuration of the electrodes formed by the processes of metal deposition followed by the processes of metal patterning and etching. Then sacrificial material is deposited over the electrodes. The surface of the sacrificial layer is often polished to form flat surface. Mechanical structures are formed over or in the sacrificial layer. The sacrificial layer is later removed to form a gap between the electrodes and the mechanical structure. This removal process of sacrificial layer is often referred to as a "sacrificial layer release process".

An example of MEMS structure is shown in FIG. 3, wherein a hinge and a mirror are formed over the top of the electrodes. When voltage is applied to one of the electrodes, the mirror is pulled toward the electrode by an electrostatic force and deflected to a deflection angle because of the hinge that supports the mirror is flexible.

During the sacrificial layer release process, an etching agent is applied to remove only the sacrificial layer without attacking other structures that are supposed to remain intact. However, there are often damages to the structures in addition to the sacrificial layers due to the damages caused by the attack of the etching agent to other structures too. There are several ways to avoid these damages. One of the methods is to use etchant that attacks and removes only the sacrificial layer but does not attack other structures. However, it is often difficult to find such etching agent. Another way is to apply an etch stop layer, which covers the remaining structures with a layer consisting of material which is not attacked by the etchant. When the surface of protective layer is flat, there are many choices of material and deposition methods. However, when the surface is not flat and having topographical shapes, it is very difficult to stop the leak of the protection layer and the etchant penetrates the protective layer through the leak and destroys the structures under the protective payer.

FIG. 1A shows an example of a planar etch stop layer (104) of a micromirror with CMOS transistors (114) in a substrate (111), metal layers (105, 108, 109) for electrical connections for circuitry, electrodes (102) providing voltages to an MEMS mirror (101) having a vertical hinge (103). There is Inter-Layer Dielectric (ILD) shown at 106, 107 and 108 as insulating material. The ILD is often made of $SiO_2$ and receives attack by etchant such as HF. An example of a planar etch stop layer is shown at 104. FIG. 1 illustrates an example of a MEMS structure such as micromirror with electrical wiring (105, 108, 109), a transistor (114), electrodes (102), a vertical hinge (103) and a mirror element (101). The fabrication process requires the use of sacrificial layers, which are filled among final structures including a mirror, a hinge, electrodes and a back plane (all structures below 104). The sacrificial layers must be removed to form the MEMS structures. This removal process is often referred to as a release process. During release process, necessary structures are often damaged because of the lack of strong protection against etchant used for release process.

When a sacrificial layer is inorganic, such as SiO2, it often provides hard, but easy to shape material and ideal for a sacrificial layer. It is also easy to remove with acid etchant, such as HF. However such etchant often leaks through a protective layer and etches and damages ILD (inter-layer dielectric) of CMOS or other types of electronic circuitry, because ILD is often SiO2 itself.

It is often difficult to find right material for a protection layer that is resistant to etchant and also electrically insulating to avoid electrical leak between electrodes. When the surface to protect is not flat and topographic, the surface is often vulnerable to the attack by etchant, even if the protective layer is resistant to etchant when it is flat. Many types of materials were tested as a protective layer, including ceramics, oxides and nitrides. These inorganic materials turned out to be vulnerable to the attack by etchant when applied with these etch stop layer formed with different topological shapes.

Therefore a need still exists in the art of applying MEMS technologies for manufacturing electronic and optical components and devices to provide a method and material to form a strong etch stop layer especially when the surface is not flat such that the above discussed difficulties and limitations may be resolved.

SUMMARY OF THE INVENTION

An aspect of this invention is to provide a strong protective layer, which can survive the release etching of sacrificial layer by applying a vapor etchant such as HF. When wet etchant is used and a sacrificial layer is etched in liquid, MEMS structures are often destroyed by a capillary force when both liquid etchant and air co-exist in the gap. Because of this destructive capillary force, manufacturers often use vapor phase etchant to avoid the conditions that could generate this destructive capillary force during the sacrificial release etching process.

However, the vapor phase etchant often penetrates into a protective layer more than liquid etchant and destroys structures under the protective layer. When a protective layer is formed over topographical structures, top or bottom corners often have micro cracks, which allow the penetration of vapor etchant. The increase of the thickness of the protective layer does not necessarily eliminates the micro cracks in the corners and able to solve the problem of leak through these micro cracks. On the other hand, an increase of thickness of the protective layer may sometimes cause other problems such as a peal off of the protective layer when the attachment of the layer does not have sufficient strength to hold the thicker protective layer to securely attach to a surface.

An etch stop layer or protective layer must be insulator or must have very high electrical resistivity to avoid undesirable electrical leak from electrodes. Therefore, metal is not a suitable material for application as a protective layer. Dielectric materials or undoped semiconductors that have sufficiently high electrical resistivity are suitable.

Another aspect of this invention is to provide a flat protective layer formed with vias to connect the structures electrically between the lower and upper parts of the layer. This structure can prevent the leak of etchant through the protective layer into the MEMS structure even when there are topographical feature with corners.

Another aspect of this invention is to form the MEMS structure with a semiconductor material and then applying the same semiconductor material without doping or implant to function as a good protective layer as well as insulation layer. In this particular configuration, the etchant selected to carry out the sacrificial release should not attack the protective layer, because the etchant is specifically chosen not to attack the MEMS structure.

DETAILED DESCRIPTION OF THE PREFERRED EMBODIMENTS

The object of this invention is to provide new and improved structures for MEMS devices to enable convenient and stable manufacturing processes by effectively protecting the MEMS structure from the attack of an etchant applied in a release process. With the new and improved device structure and protecting materials, the destruction of the MEMS structures is prevented.

Figure 1A:
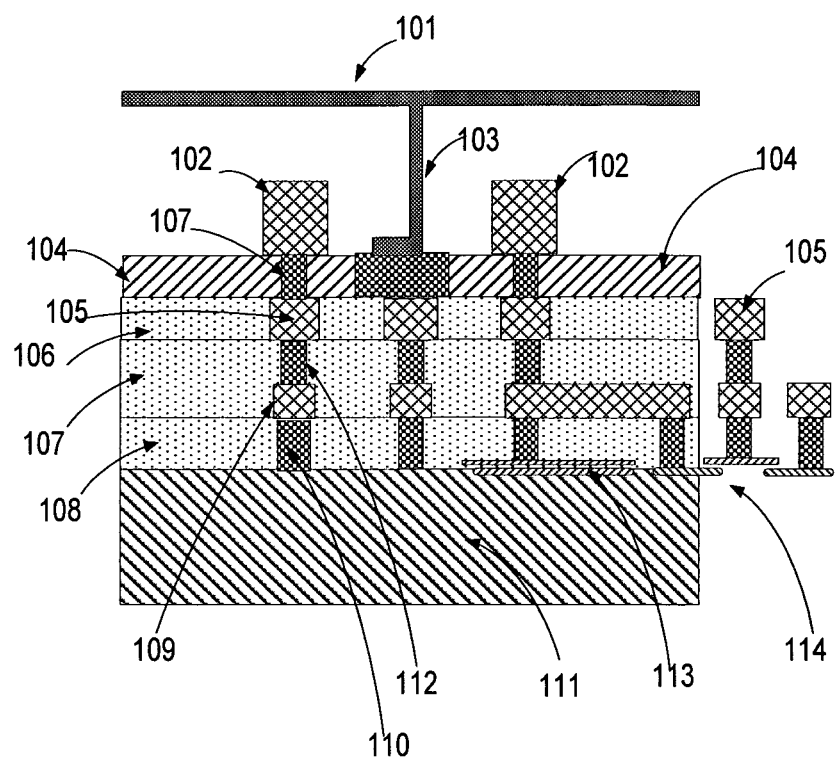
FIG. 1A is a cross sectional view for illustrating the manufacturing process of sacrificial release and potential damages that may cause to the MEMS structures.
Figure 1B:
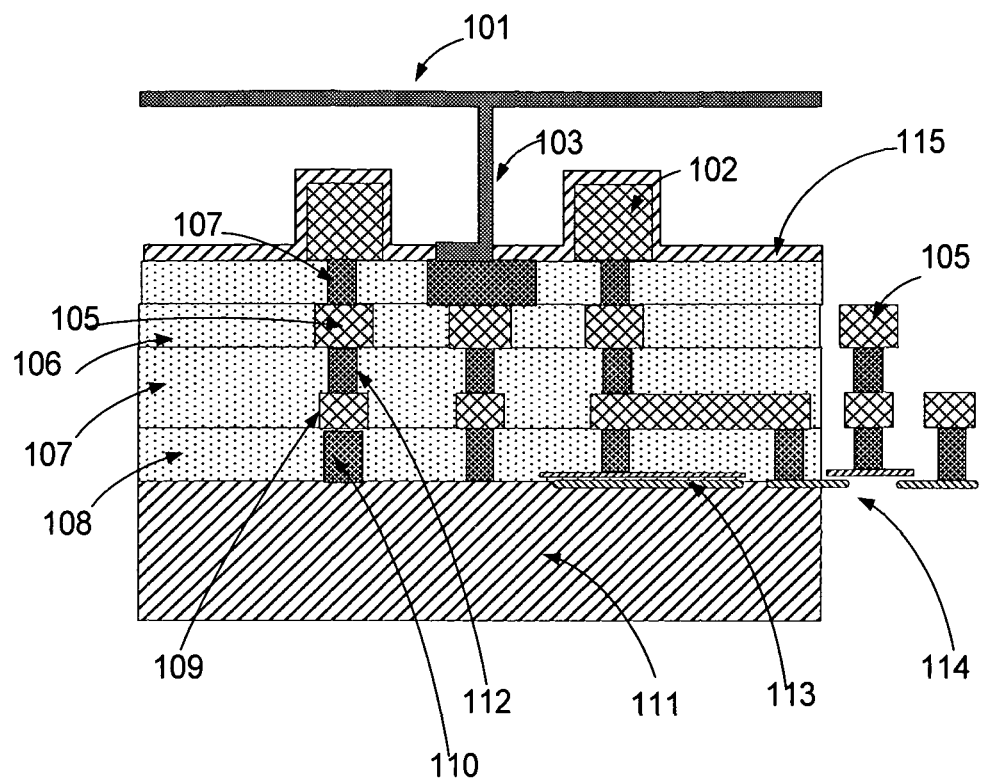
FIG. 1B shows a conformal etch-stop layer (115) as an exemplary embodiment of this invention.
Figure 2:
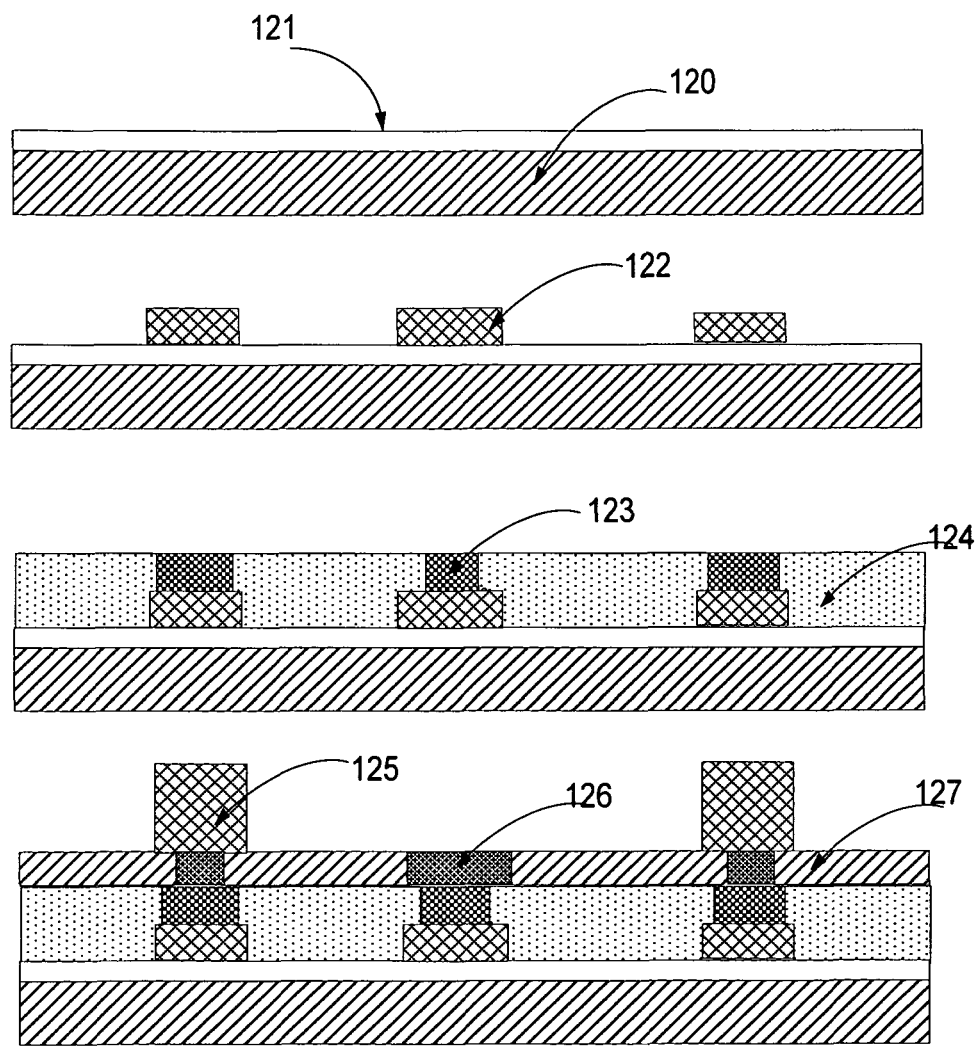
FIG. 2 is a cross sectional view for illustrating an exemplary embodiment of this invention for providing a planar etch stop layer.

FIGS. 2A to 2D are cross sectional views for illustrating an exemplary embodiment of this invention for providing a planar etch stop layer. An inter-layer dielectric (ILD), (121) is deposited on a substrate (120). In FIG. 2B, a metal layer (122) is deposited and patterned on the ILD. In FIG. 2C, another ILD (124) is deposited and patterned for vias (123). The ILD 124 layer is generally formed with SiO2 and is vulnerable to attack by the HF etchant. A protective coating of silicon nitride (SiNx), silicon carbide (SC), and Al2O3 has been tested and found not effective. After planarizing the surface of the ILD and the vias, in FIG. 2D, an etch stop layer (127) composed of planar silicon sheet is deposited and patterned for vias (126). After planarization, metal electrodes (125) are deposited and patterned. Effective protection against etchant HF is accomplished with the protective layer 127 formed as planar silicon sheet that can be deposited by applying a PECVD process. A release etch is carried out by applying a HF etchant to remove the sacrificial layer that is generally formed as a glass (SiO2) layer. The HF etchant usually penetrates into the CMOS structure and etches away the ILD layers. For these reasons, a protective etch stop layer such as layer 127 comprising planar silicon sheet is necessary to cover the CMOS structures.

Figure 3:
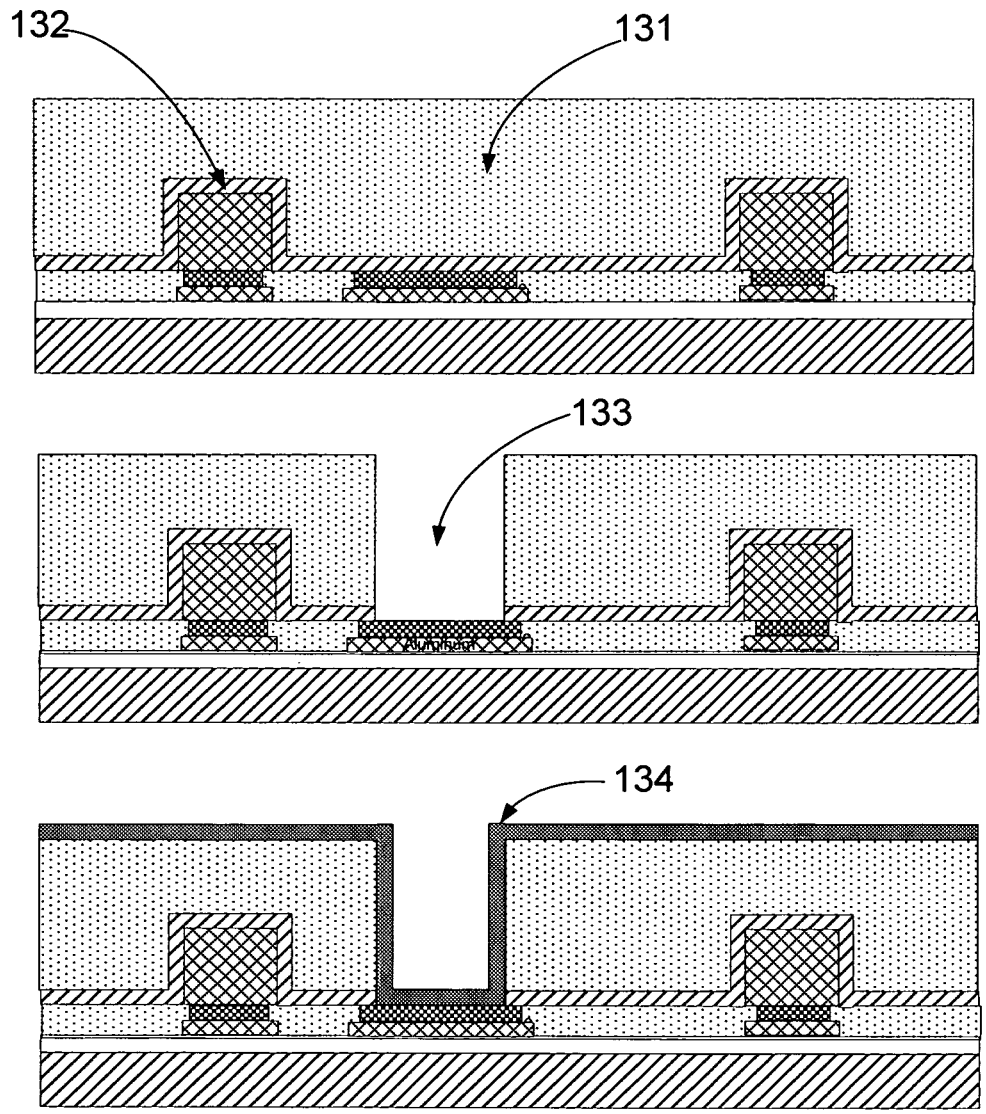
FIG. 3, FIG. 4, FIG. 5, FIG. 6 and FIG. 7 are cross sectional views for illustrating how a micromirror is constructed using a conformal etch stop layer of this invention.
Figure 4:
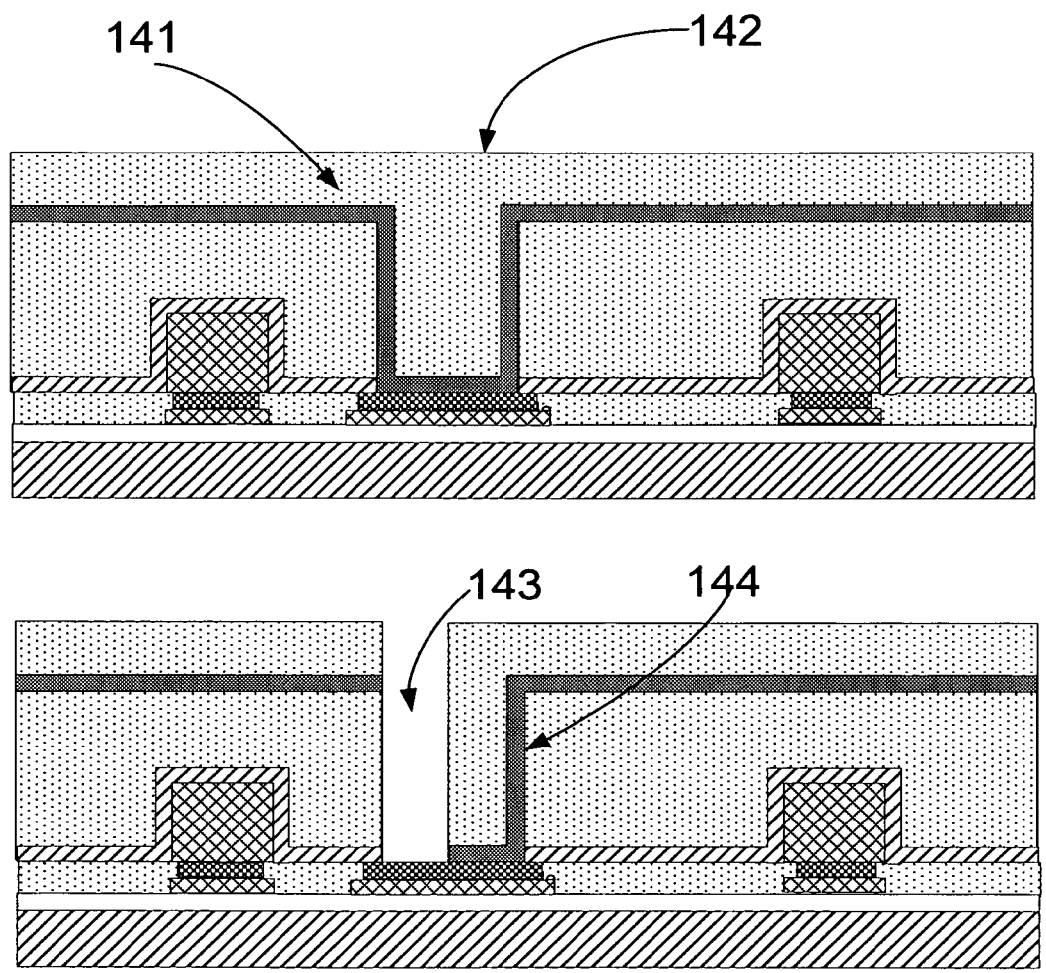
Figure 5:
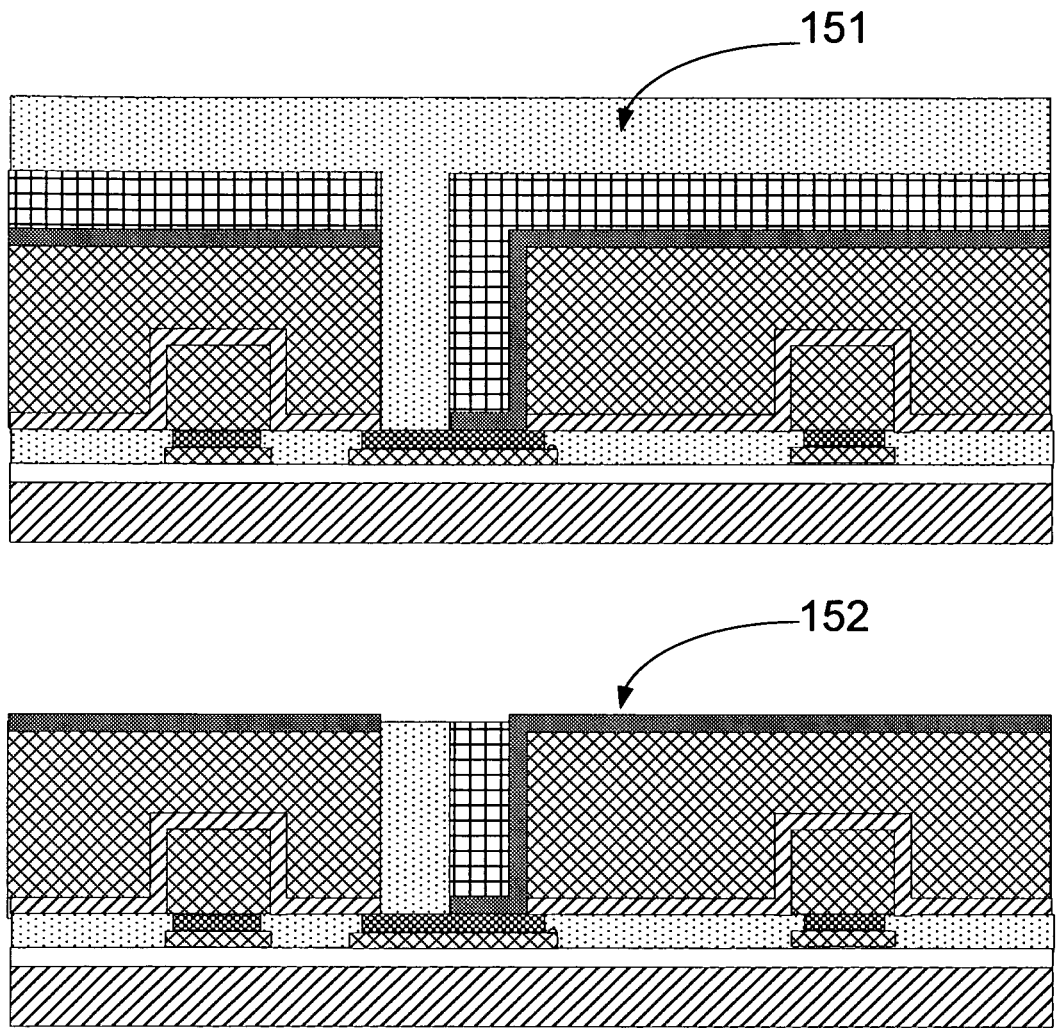
Figure 6:
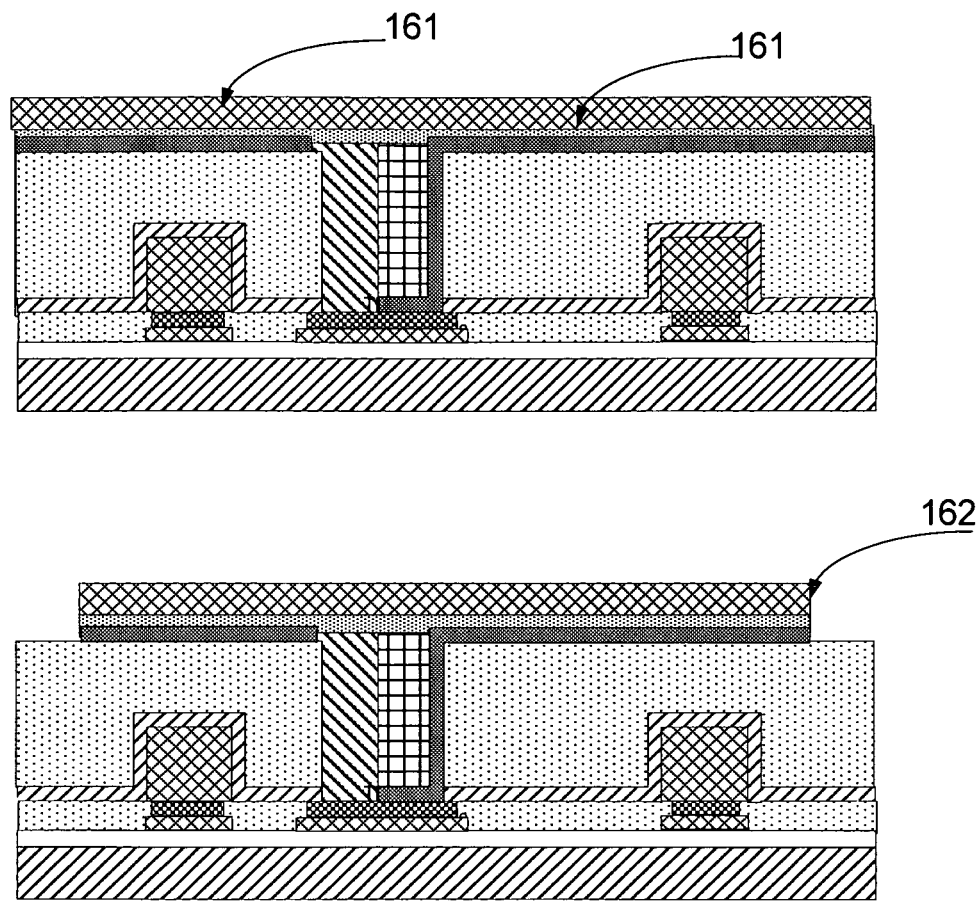
Figure 7:
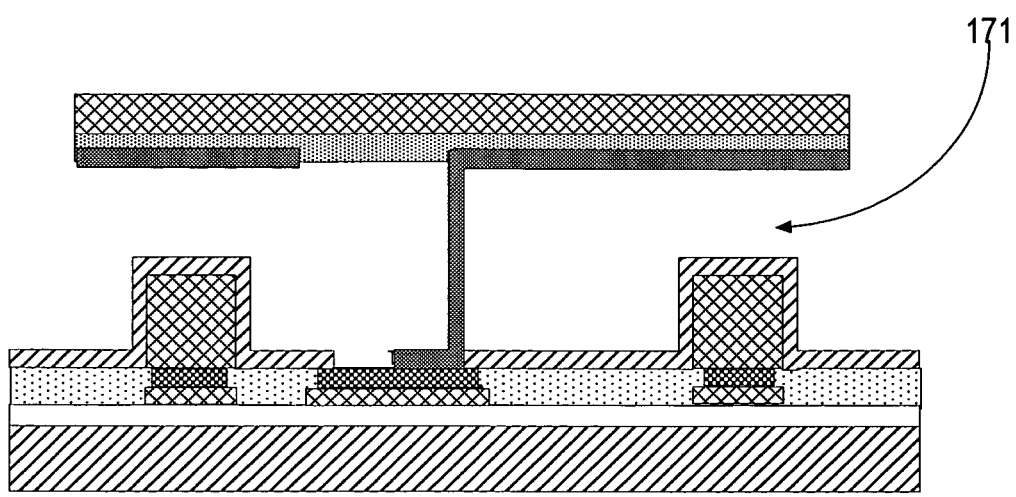

FIG. 3, FIG. 4, FIG. 5, FIG. 6 and FIG. 7 are cross sectional views for illustrating how a micromirror is formed with a release etch process using a conformal etch stop layer (132). In FIG. 3, a sacrificial layer (131) is deposited and planarized. A hole (133) is patterned and etched. A layer of hinge material (134) is deposited as a vertical wall of the hole. In FIG. 4A, a second sacrificial layer (142) is deposited and planarized. In FIG. 4B, a portion of the deposited hinge material layer 134 is etched at a newly patterned area, "Hinge Etch Hole" (143) is opened to form a vertical hinge (144) by removing the part of the vertical wall. In FIG. 5A, the hinge-etch-hole is filled with a sacrificial material (151). In FIG. 5B, the surface of the sacrificial material is planarized and etched to expose the top 152 of the vertical hinge. In FIG. 6A, a connecting material layer (161) is formed and in FIG. 6B, a mirror material layer (162) is deposited with the connecting layer material layer (161) disposed between the hinge material (152) and mirror material (162). In FIG. 7, a mirror is patterned and all sacrificial materials are removed with space 171 underneath the mirror 162 to make the mirror movable. Unlike the conventional processing techniques, in this invention etch stop layer composed of silicon and formed with a combination of conformal and planar layer structures. The processes and structure as disclosed are new and not obvious when compared to the existing technologies that are now commonly implemented.

Figure 8:
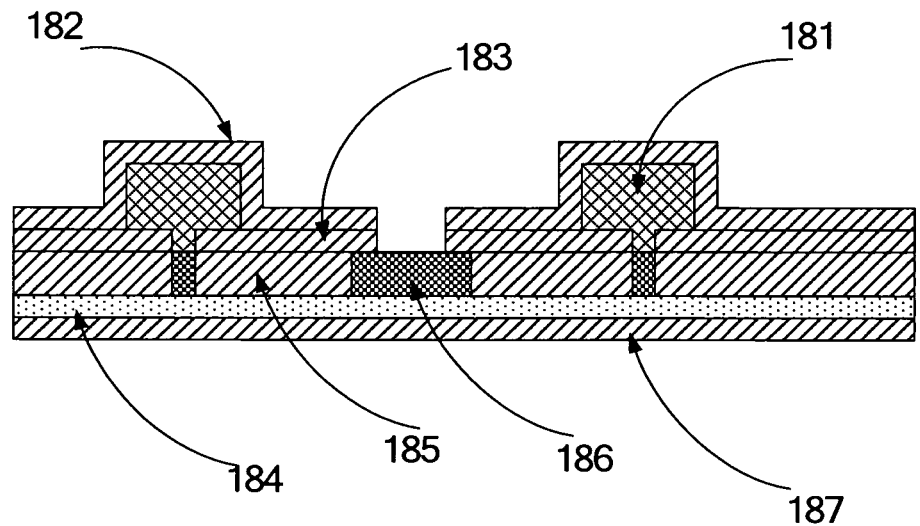
FIG. 8 and FIG. 9 show another embodiment of this invention for etch-stop-layers with both conformal and planar layers.
Figure 9:
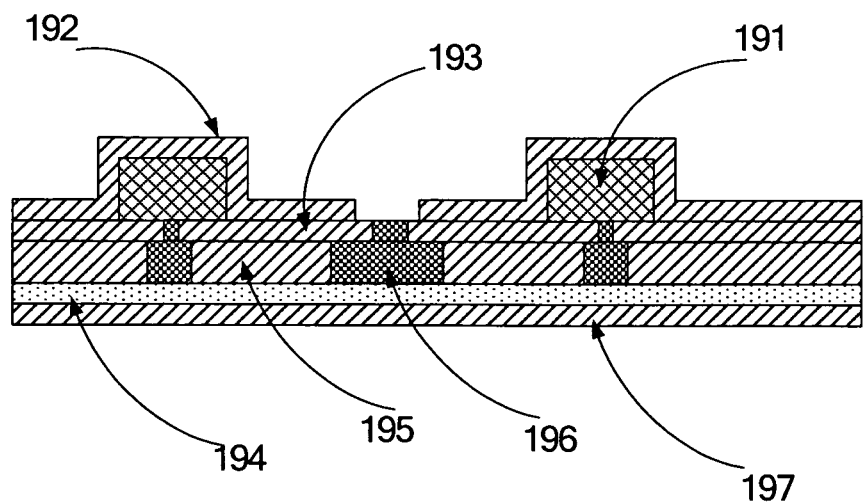

FIG. 8 and FIG. 9 show another embodiment of this invention for etch-stop-layers with both conformal (182) and planar (183) layers. The holes in the planar layer are filled with electrode material in FIG. 8 and with via material in FIG. 9. According to FIGS. 8 and 9, layers 181 and 191 are aluminum electrodes, layers 182 and 192 are conformal coating layers, layers 183 and 193 are planarized protective coatings, via 186 and 196 are via holes filled with electrode materials, and layers 184 and 194 are metal layers. A combination of planar protection layers as shown are new and also provides effective protection of the MEMS structure against etchant penetration thus the structures underneath the protection layers are prevented from etchant attack and destruction.

Figure 10:
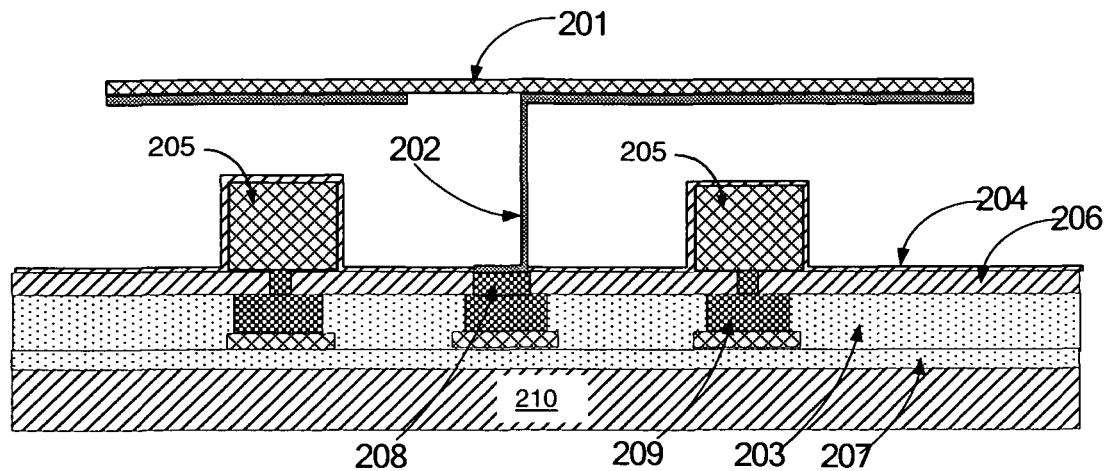
FIG. 10 and FIG. 11 are cross sectional views for showing two other embodiments of this invention.
Figure 11:
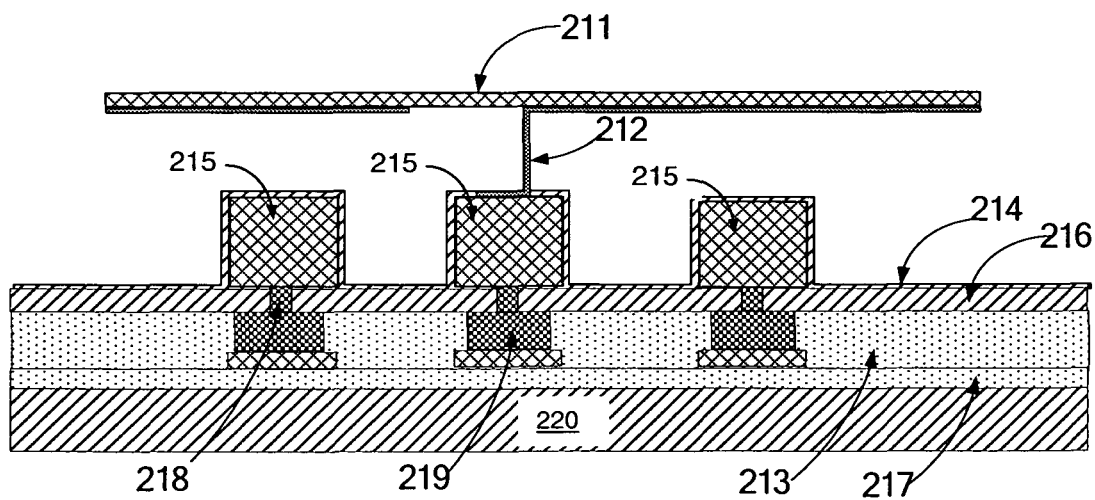

FIG. 10 and FIG. 11 are cross sectional views for showing two other embodiments of this invention. A planar etch-stop-layer (206) is formed over electronic circuitry (209) covered by a conformal etch stop layer (204 and 214) that also covers over the electrodes (205). Electrodes (205) are formed over the etch-stop-layer (206). Via connectors (208 and 209) are formed through the etch-stop-layer and the substrate to connect the circuitry and the electrodes as well as connecting the circuitry and a mirror through a hinge in FIG. 10. Via connectors (218 and 219) are formed through the etch-stop-layer (216) and the substrate to connect the circuitry (218) and electrodes (215) and a mirror (211) and a hinge (212) are formed over one of the electrodes (215) in FIG. 11. The planar and conformal layers 204 and 214 as shown in FIGS. 10 and 11 are effective to protect the attack of etchant covered under the etch stop layers 205 and 215.

Figure 12:
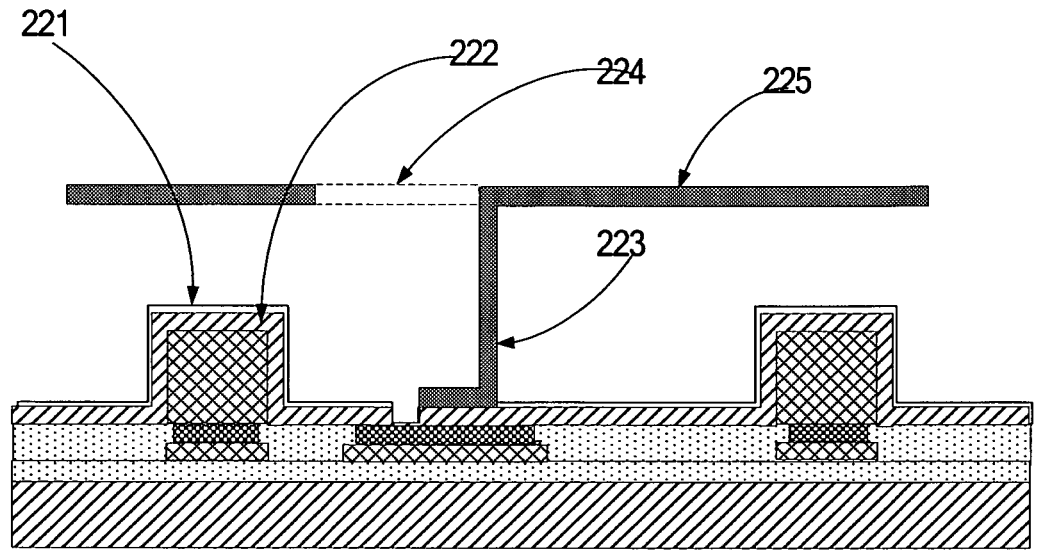
FIG. 12 shows another embodiment of this invention, wherein a mirror and a vertical hinge are formed as a common layer over an etch-stop-layer.

FIG. 12 shows another embodiment of this invention, wherein a mirror (225) and a vertical hinge (223) are formed as a common layer over an etch-stop-layer (222). The layers 221 and 222 are effective for protecting the etchant from attacking the structures covered under these layers.

Figure 13:
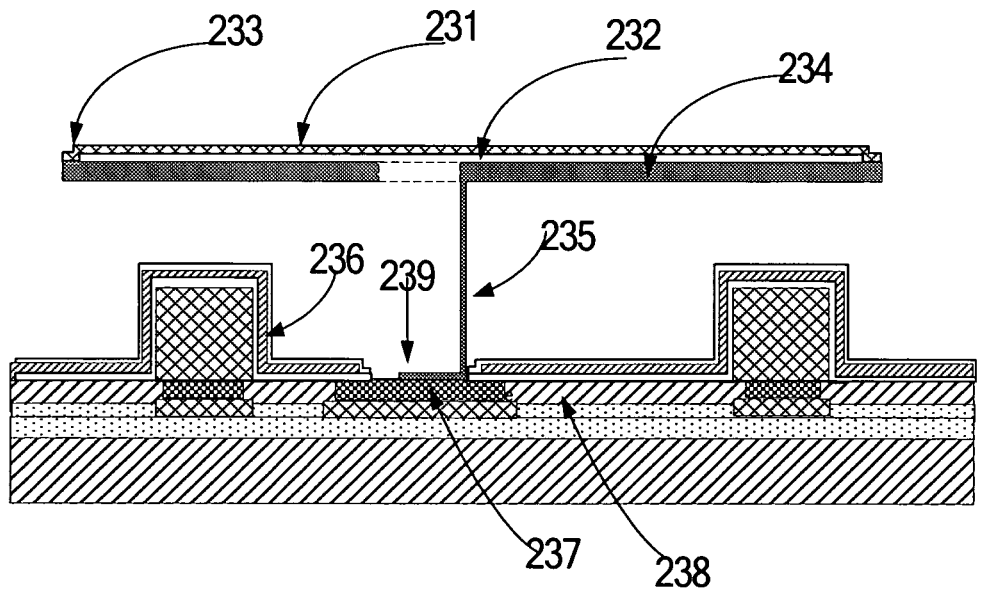
FIG. 13 is a cross sectional view for showing another embodiment of this invention.

FIG. 13 shows another embodiment of this invention, wherein a mirror (231) is formed on a residual sacrificial layer (232) over the hinge-top-plate (234) formed with a vertical hinge (235). The mirror (231) and the hinge-top-plate (234) are connected at the edge of the hinge-top-plate (234). The vertical hinge (235) is formed in a hole (239) of etch-stop-layers (236, 238) over a via (237) which is resistant to the etchant of release.

Figure 14:
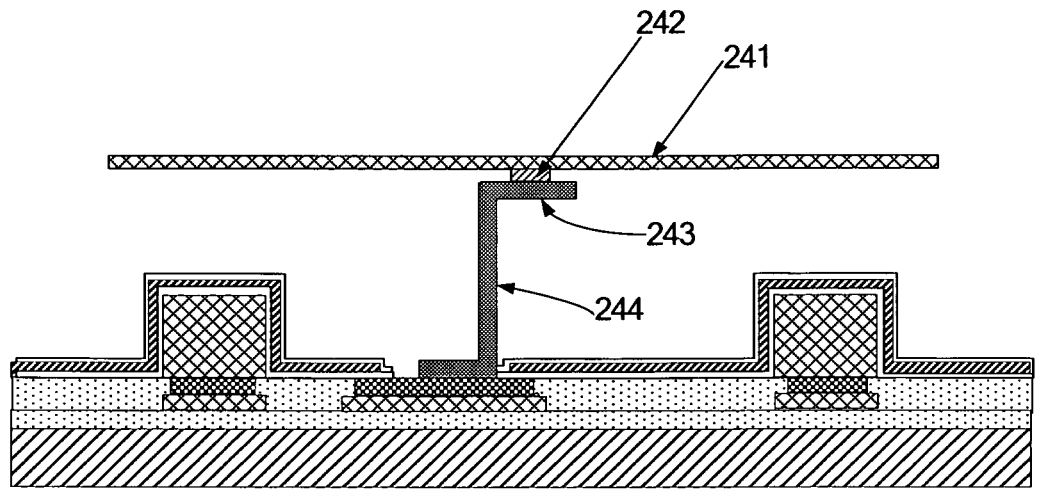
FIG. 14 is a cross sectional view for showing an alternate embodiment of this invention wherein a mirror is formed on a connecting material between a hinge-top plate and a mirror.
Figure 15:
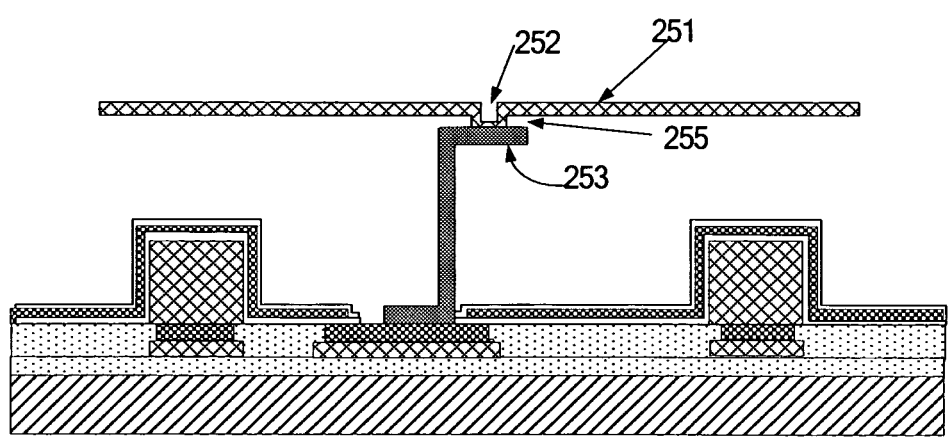
FIG. 15 is a cross sectional view for showing another embodiment of this invention, wherein a mirror is formed over a hole in a sacrificial layer which is residual over a hinge-top-plate.
Figure 16:
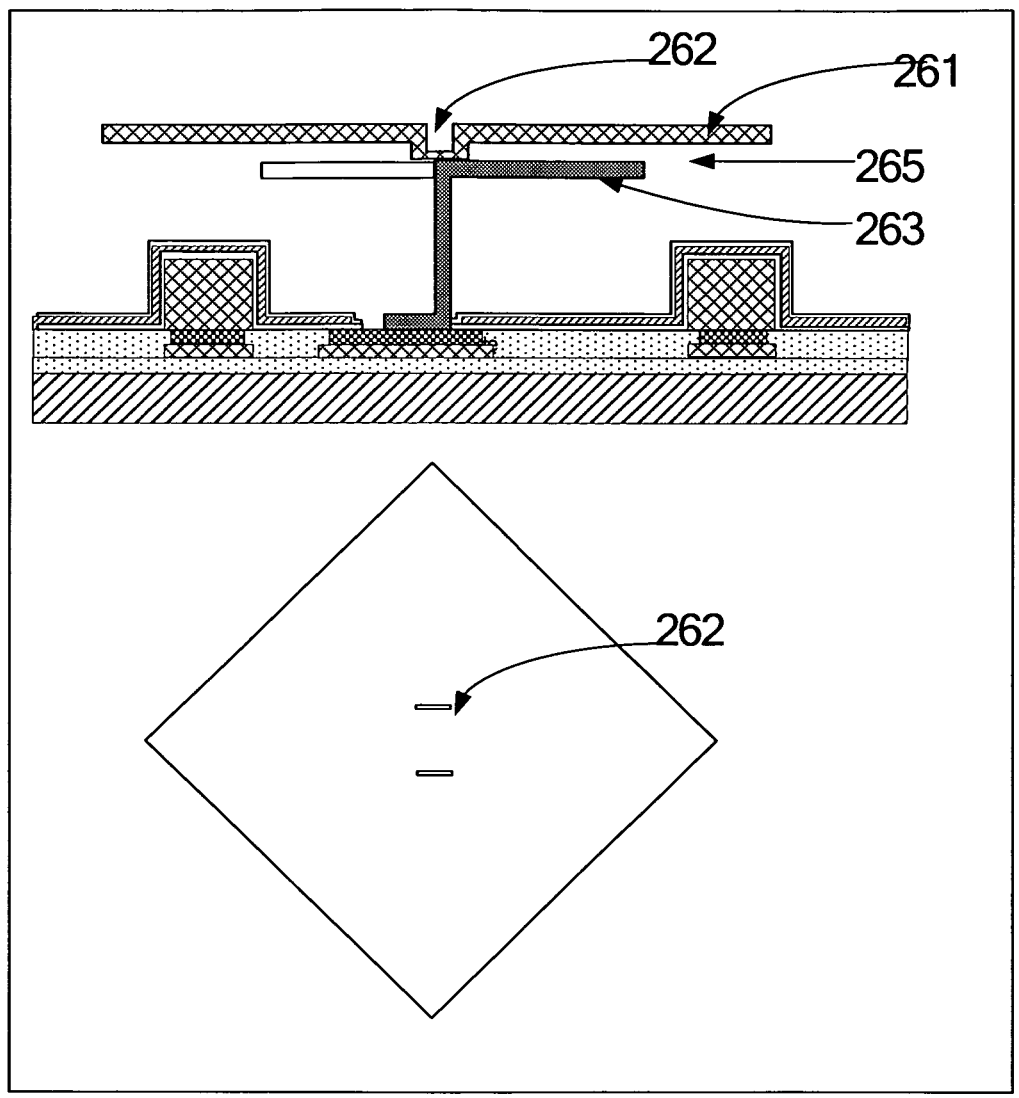
FIG. 16 is a cross sectional view for showing another embodiment of this invention, wherein a mirror is formed over walls in a sacrificial layer which is residual over a hinge-top-plate.
Figure 17:
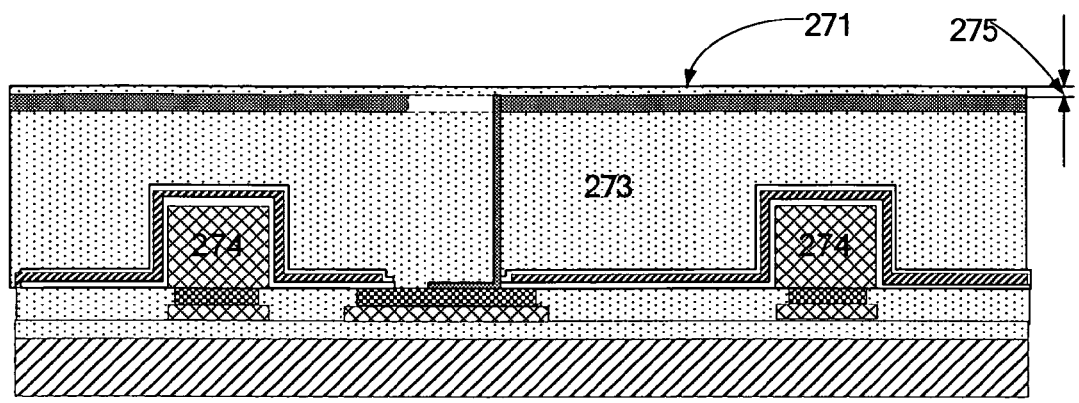
FIGS. 17 to 22 are cross sectional views to show the detail structures for the embodiments as shown in FIG. 13.
Figure 18:
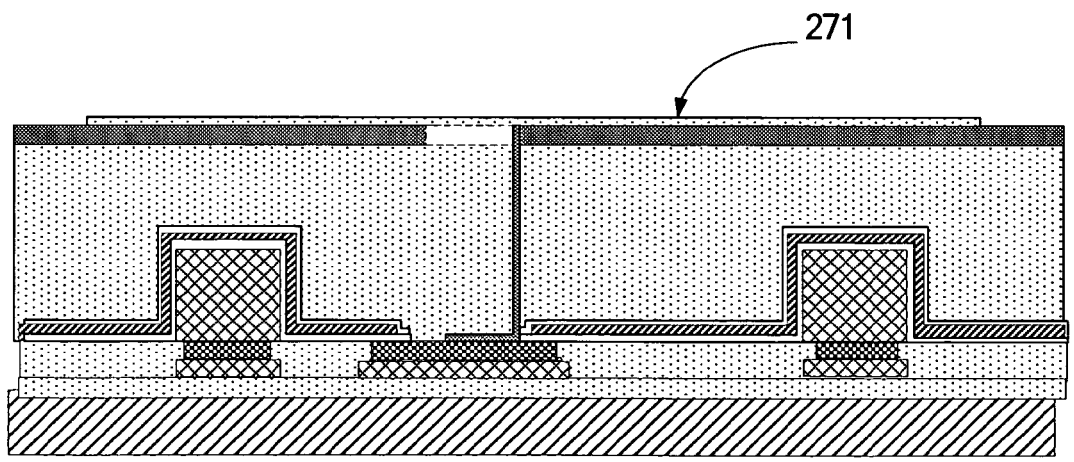
Figure 19:
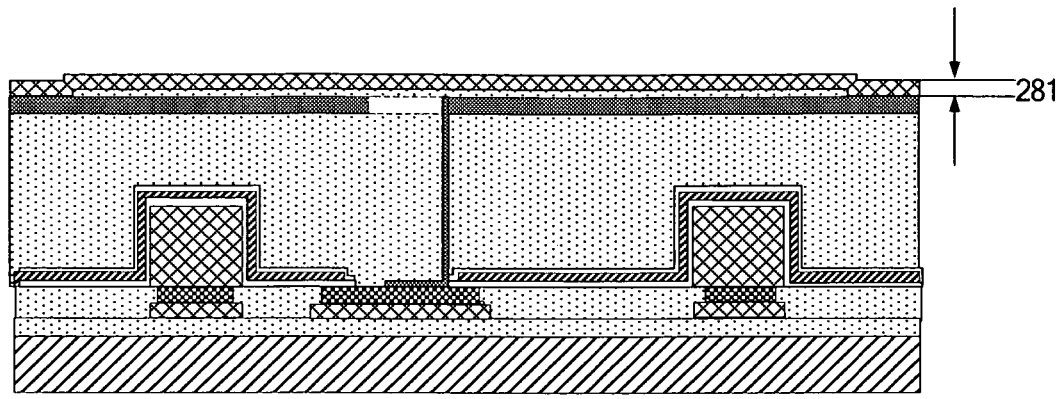
Figure 20:
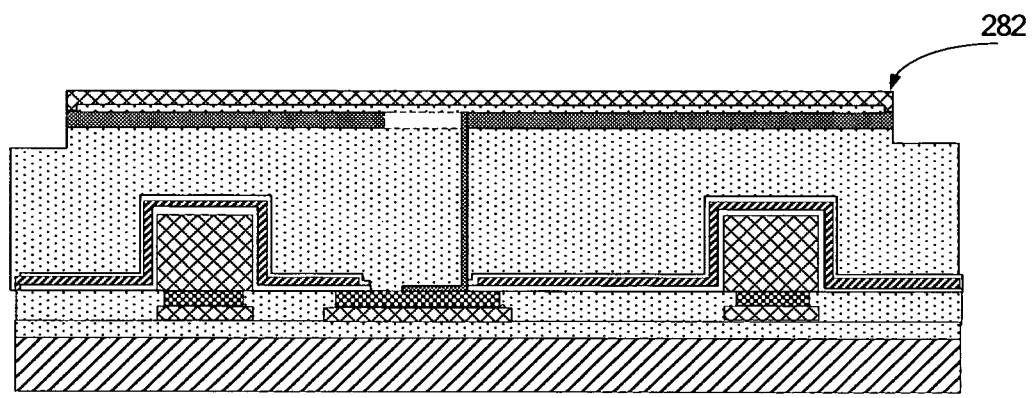
Figure 21:
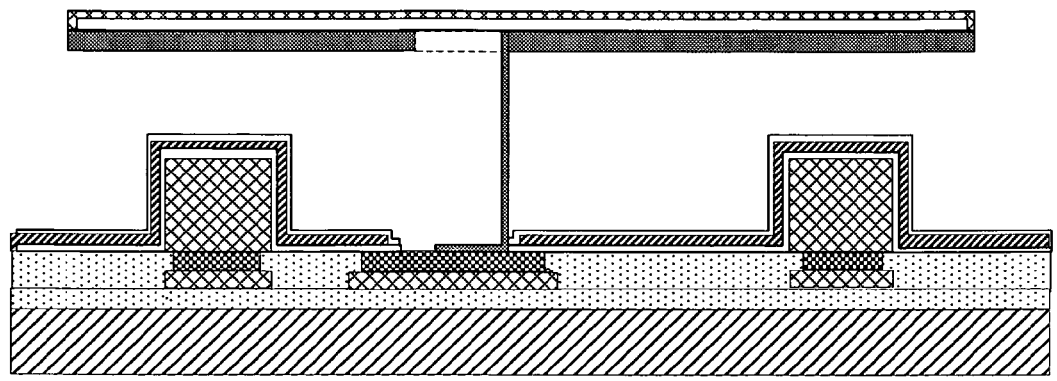
Figure 22:
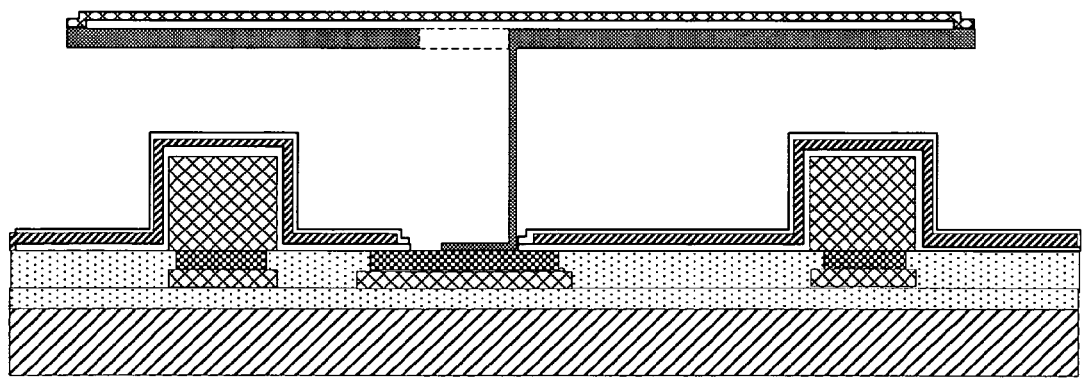

FIG. 14 shows another embodiment of this invention, wherein a mirror (241) is formed on a connecting material (242) between a hinge-top-plate (243) and a mirror (241). FIG. 15 shows another embodiment of this invention, wherein a mirror (251) is formed over a hole (252) in a sacrificial layer (255), which is residual over a hinge-top-plate (243). FIG. 16 shows another embodiment of this invention, wherein a mirror (261) is formed over walls (262) in a sacrificial layer (265), which is residual over a hinge-top-plate (263). FIGS. 17 to 22 show the embodiments in FIG. 13. FIG. 13, FIG. 21 and FIG. 22 are other embodiments of this invention. These embodiments overcome the manufacturing difficulties of FIG. 10 and FIG. 11. FIG. 17 to FIG. 20 show the manufacturing processes to make FIG. 13, FIG. 21 and FIG. 22 structures. To produce FIG. 10 or FIG. 11 structures, the manufacturing process requires the thickness of residual layer of 271 and 275 in FIG. 17 equal to zero. This process usually causes over-etch and creates a dip in the hole in the middle of mirror plate. The dip often causes unnecessary reflection of incoming light and is undesirable. The structures in FIG. 13, FIG. 21 and FIG. 22 are to allow residual sacrificial layer and still avoid a dip in the mirror plate.

Various materials are processes are tested in attempting to find effective etch stop layers and configurations for protecting the MEMS structures. According to the results of these tests, there are two effective approaches. The first approach is form a planar protective layer with through holes filled with vias to connect electrical circuitry below the protective layer and the electrodes above the layer. This structure can avoid topological shape where the leak of etchant often takes place. The second method found to be effective was to use a semiconductor material as a protective layer. Some semiconductor materials turned out to be very resistant to etchant even at topology. To avoid electrical conductivity between electrodes, some methods were also developed. One is to use un-doped semiconductor, which shows almost no conductivity. The other method is to dope and form PN junction intentionally opposite polarity to the applied voltage between electrodes, so that electrical current will not flow between the electrodes.

According to the descriptions and drawings discussed above, this invention discloses a mirror device and the mirror device includes a plurality of electrodes disposed on a substrate. A hinge connected to at least one of the electrodes. A mirror connected to the hinge and corresponding to at least one of the electrodes, wherein a barrier layer is disposed between the hinge and the mirror, and/or between the hinge and the electrode. In a preferred embodiment, the mirror of the electrode is composed of a material including aluminum, and the barrier layer is composed of a material different from that of the mirror. In another preferred embodiment, the barrier layer includes at least two layers. In another preferred embodiment, the hinge stands approximately vertically between the electrode and the mirror. The width of the hinge is greater than or is equal to the height of the hinge. In another preferred embodiment, the hinge stands substantially along a vertical direction between the electrode and mirror. The cross sectional area of the end portion of the hinge closer to the electrode is less than or equal to the cross sectional area of the hinge end closer to the mirror. In another preferred embodiment, the electrode is composed of a material containing aluminum and the surface of the electrode further includes a protecting layer containing silicon. In another preferred embodiment, the height of the plurality of electrodes is approximately the same. In another preferred embodiment, the height of at least one of the electrodes connected to the hinge is different from that of other electrodes. In another preferred embodiment, at least one of the electrodes is connected to a via which is connected to a wiring within the substrate and another electrode is placed in a same layer as the via. In another preferred embodiment, at least one of the electrodes is placed within the substrate. In another preferred embodiment, the length of the hinge is 2 μm or smaller. The mirror is approximately square shaped with a length of a side of the square approximately 10 μm or smaller.

This invention further discloses a method for manufacturing a mirror device. The method includes a step of forming a circuit and a wiring on a substrate. The method further includes a step of forming an electrode connected to both the wiring and the circuit on the substrate. The method further includes a step of forming a sacrifice layer on the surfaces of the substrate and electrode, opening a hole form the surface of the sacrifice layer to the electrode. The method further includes a step of forming a hinge layer in the hole that has been opened on the sacrifice layer, etching the hinge layer by using a mask, and forming a barrier layer on the etched hinge layer. The method further includes a step of forming a mirror layer on the hinge layer and the barrier layer and forming a protective layer on the mirror layer by employing a chemical vapor deposition (CVD). In another embodiment, the method further includes a step of dicing the substrate, removing the sacrifice layer and coating an anti-stiction layer.

This invention further discloses a MEMS device supported on a substrate. The device further includes an electronic circuit formed on the substrate and at least an electrode connected to the circuit and at least a mechanical movable element controlled by the electrode. The device further includes a flat protective layer disposed between the electrode and the circuit wherein the protective layer has at least a through hole filled with via for connecting the electrode and the circuit. In a preferred embodiment, the MEMS device is a micromirror supported on a vertical hinge. In another embodiment, the vertical hinge is connected to a reflective and movable element with a structure in the group of posts, pillars and walls. In another preferred embodiment, the protective layer is a semiconductor material. In another embodiment, the material of the protective layer is composed of a material in a group of materials consist of Si. SiC, Ge, SiGe, SiNi, and SiW. In another preferred embodiment, the semiconductor layer is doped and forming a PN junction with reverse polarity to the voltage applied to the electrode to prevent electric current from the electrode.

This invention further discloses a MEMS device supported on a substrate formed with electric circuit thereon. The MEMS device further includes at least an electrode connected to the circuit and at least a movable element that is controlled by the electrode. The MEMS device further includes a conformal protective layer over the electrode and the circuit wherein the protective layer is semiconductor-based material. In a preferred embodiment, the MEMS device is a micromirror and the semiconductor material is one of a group of materials consisting of Si, SiC, Ge, SiGe, SiNi and SiW.

This invention further discloses a micromirror device supported on a semiconductor substrate formed with electrode connecting to a circuit on the substrate. The micromirror device further includes at least a reflective and movable element controlled by the electrode. The micromirror device further includes a vertical hinge formed by etching part of a vertical wall of a semiconductor layer and a protective layer made of a semiconductor material. In a preferred embodiment, the vertical hinge is connected to the reflective and movable element with a structural feature as a post structure or a pillar structure or a wall structure.

This invention further discloses a micromirror device supported on a semiconductor substrate formed with electrode connecting to a circuit on the substrate. The micromirror device further includes at least a reflective and movable element controlled by the electrode. The micromirror device further includes a flat protective layer between the electrode and the circuit wherein the protective layer has at least a conductive area by doping the connecting electrode and the circuit electrically.

This invention further discloses a micromirror device supported on a semiconductor substrate formed with electrode connecting to a circuit on the substrate. The micromirror device further includes at least a reflective and movable element controlled by the electrode. The micromirror device further includes a vertical hinge formed by etching the part of a vertical wall of a semiconductor layer and the hinge is connected to a mirror with a plug. In a preferred embodiment, the hinge is formed on one of the electrodes. In another preferred embodiment, at least one barrier metal is formed adjacent to the plug.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

I claim:

1. A MEMS device supported on a substrate comprising:
an electronic circuit disposed on said substrate;
at least an electrode connected to said electronic circuit for receiving control signals from said electronic circuit;
at least a mechanical movable reflective element controlled by said control signals received by said electrode;
a combined etch-stop protective structure includes a planar etch stop layer disposed on a top surface of the substrate immediately below the electrode and completely covering said electronic circuit underneath and wherein said combined etch-stop protective structure further includes a conformal etch-stop layer covering said planar etch stop layer and said electrode electrically connected to said circuit disposed below the planar-etch stop layer; and
a hinge extends vertically from a top surface of the electrode and supports the mechanically movable reflective element of top of the hinge.

2. The MEMS device of claim 1 wherein
said conformal etch-stop layer further covering electrode sidewalls.

3. The MEMS device of claim 1 wherein:
said first etch-stop protective layer is composed of a semiconductor material.

4. The MEMS device of claim 1 wherein:
said planar etch-stop protective layer is composed of one of a semiconductor material in a group consists of Si, SiC, Ge, SiGe, SiNi and SiW.

5. The MEMS device of claim 1 wherein:
said planar etch-stop protective layer is composed of a semiconductor material doped as a PN junction with a reverse polarity to a voltage applied to said electrode to prevent an electrical current transmitting from said electrode to said planar etch-stop protective layer.

6. A MEMS device comprising:
a substrate;
an electronic circuit disposed on said substrate;
at least an electrode connected to said electronic circuit for receiving control signals;
at least a mechanical movable reflective element supported on top of a vertical hinge controlled by said control signals received by said electrode; and
a combined etch-stop protective structure includes a planar etch stop layer disposed on a top surface of the substrate immediately below the electrode and completely covering said electronic circuit underneath, wherein said combined etch-stop protective structure further includes a conformal protective layer covering over a top surface and sidewalls of said electrode wherein said etch-stop conformal protective layer is semiconductor material and wherein the vertical hinge extends vertically from a top surface of the electrode disposed above the planar etch stop layer.

7. The MEMS device of claim 6 wherein:
said mechanical movable reflective element comprises a plurality of mirror elements each having a micromirror and said semiconductor material is composed of one of the materials in a group consists of Si, SiC, Ge, SiGe, SiNi and SiW.

8. A micromirror device comprising:
a substrate;
an electronic circuit disposed on said substrate;
at least an electrode connected to said electronic circuit for receiving control signals;
at least a mechanical movable reflective element controlled by said control signals received by said electrode;
a combined etch-stop protective structure includes a planar etch stop layer disposed on a top surface of the substrate immediately below the electrode and completely covering said electronic circuit underneath and wherein said combined etch-stop protective structure further includes a conformal etch-stop layer covering said planar etch stop layer and said electrode; and
a vertical hinge extends vertically from a top surface of the electrode supported on top of the planar etch-stop protective layer wherein said planar etch-stop protective layer has at least a through-hole filled with a via connector for connecting between said electrode disposed on top of the via connector and said electronic circuit completely covered by said via connector and said planar etch stop protective layer made of a semiconductor material.

9. The MEMS device of claim 8 wherein
said vertical hinge supports the mechanical movable reflective element.

10. A MEMS device comprising:
a substrate supporting an electric circuit thereon;
a combined etch-stop protective structure includes a planar etch stop protective layer disposed on a top surface of the substrate completely covering said electronic circuit underneath and wherein said combined etch-stop protective structure further includes a conformal etch-stop layer covering said planar etch stop layer and at least an electrode disposed on top of the planar etch-stop protective layer wherein said planar etch-stop protective layer further comprises at least a doped area on top of the electronic circuit;
the electrode disposed on top of said doped area of said planar etch-stop protective layer for electrically connecting to said electronic circuit disposed below the planar etch-stop protective layer; and
a vertical hinge supports and connected to a moveable reflective element on top of the hinge wherein the hinge extends vertically from a top surface of the electrode.

11. A MEMS device comprising:
a substrate supporting an electric circuit thereon;
a combined etch-stop protective structure includes a planar etch-stop protective layer disposed on a top surface of the substrate completely covering said electronic circuit underneath and wherein said combined etch-stop protective structure further includes a conformal etch-stop layer covering said planar etch stop layer and at least an electrode disposed on top of the planar etch-stop protective layer;
the electrode disposed on top of said planar etch-stop protective layer is electrically connected to said circuit through a via connector penetrated through said planar etch-stop protective layer;

at least a mechanical movable reflective element controlled by electrical signals applied to said electrode;
a vertical hinge supports and connected to said moveable reflective element;
said electronic circuit is completely covered by said planar etch stop protective layer and said via connector; and
said hinge extends vertically from a top surface of one of said electrodes.

12. The MEMS device of claim 11 wherein:
the hinge is connected to the mechanical movable reflective element with a plug.

13. The MEMS device of claim 12 wherein:
said plug is composed of a material same as said movable reflective element.

14. A MEMS device comprising:
a substrate supporting an electric circuit thereon;
at least an electrode connected to and receives control signals from said electric circuit;
at least a mechanical movable reflective element controlled by said control signals received by the electrode;
a combined etch-stop protective structure includes a planar etch stop layer disposed on a top surface of the substrate immediately below the electrode and completely covering said electronic circuit underneath and wherein said combined etch-stop protective structure further includes a conformal etch-stop layer covering said planar etch stop layer and said electrode electrically connected to said circuit disposed below the planar-etch stop layer;
a vertical hinge constituting a partially etched-off vertical wall of a semiconductor layer
a tab extends along a direction substantially perpendicular to said vertical hinge wherein said tab constituting a partially etched-off top horizontal plane etching simultaneously with and composed of a same material as said partially etched-off vertical wall and connected to said vertical hinge for supporting said movable reflective element thereon to function as a mirror; and
the hinge extends vertically from a top surface of said electrodes.

15. A MEMS device comprising:
a substrate supporting an electric circuit thereon;
at least an electrode connected to and receives control signals from said electric circuit;
at least a mechanical movable reflective element controlled by said control signals received by electrode;
a combined etch-stop protective structure includes a planar etch stop layer disposed on a top surface of the substrate immediately below the electrode and completely covering said electronic circuit underneath and wherein said combined etch-stop protective structure further includes a conformal etch-stop layer covering said planar etch stop layer and said electrode electrically connected to said circuit disposed below the planar-etch stop layer;
a vertical hinge constituting a partially etched-off vertical wall of a semiconductor layer;
a foot about perpendicular to said vertical hinge wherein said foot constituting a partially etched-off bottom plane etching simultaneously with and composed of a same material as said partially etched-off vertical wall and connected to a bottom part of said vertical hinge; and
said foot is disposed on top of a top surface of said electrode electrically connected to the circuit covered under the planar etch-stop protective layer.

* * * * *